United States Patent
Fujimoto et al.

(10) Patent No.: US 9,070,817 B2
(45) Date of Patent: Jun. 30, 2015

(54) PHOTOCOUPLER AND SEMICONDUCTOR LIGHT EMITTING ELEMENT

(71) Applicant: KABUSHIKI KAISHA TOSHIBA, Minato-ku (JP)

(72) Inventors: Kenji Fujimoto, Ishikawa-ken (JP); Masanobu Iwamoto, Ishikawa-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/020,394

(22) Filed: Sep. 6, 2013

(65) Prior Publication Data

US 2014/0084305 A1    Mar. 27, 2014

(30) Foreign Application Priority Data

Sep. 21, 2012    (JP) .................................. 2012-208843

(51) Int. Cl.
- *H01L 27/15* (2006.01)
- *H01L 29/16* (2006.01)
- *H01L 31/12* (2006.01)
- *H01L 33/00* (2010.01)
- *H01L 31/173* (2006.01)

(52) U.S. Cl.
CPC .................................... *H01L 31/173* (2013.01)

(58) Field of Classification Search
USPC .................................................. 257/80, 82
See application file for complete search history.

(56) References Cited

U.S. PATENT DOCUMENTS

| 4,805,006 | A | * | 2/1989 | Yamaguchi et al. | ......... 257/436 |
| 6,762,472 | B2 | | 7/2004 | Loh et al. | |
| 6,943,378 | B2 | | 9/2005 | Kek et al. | |
| 7,235,804 | B2 | * | 6/2007 | Aki | ............................ 250/551 |
| 2004/0041246 | A1 | | 3/2004 | Loh et al. | |

FOREIGN PATENT DOCUMENTS

| JP | 58-200583 A | 11/1983 |
| JP | H6-291363 A | 10/1994 |
| JP | 06-334168 A | 12/1994 |
| JP | 2002-057374 A | 2/2002 |
| JP | 2006-100438 A | 4/2006 |

OTHER PUBLICATIONS

Japanese Office Action issued on Jan. 29, 2015 in corresponding Japanese Application No. 2012-208843, along with Engllish translation thereof.

Japanese Office Action issued on May 15, 2015 in corresponding Japanese Application No. 2012-208843, along with English translation thereof.

* cited by examiner

*Primary Examiner* — Sonya D McCall Shepard

(74) *Attorney, Agent, or Firm* — White & Case LLP

(57) ABSTRACT

A photocoupler includes: a light emitting element; a light receiving element; and a bonding layer. The light emitting element includes a semiconductor stacked body, and a first and a second electrode. The semiconductor stacked body includes a light emitting layer. The light receiving element includes a first and a second electrode on a side of a light receiving surface. The bonding layer bonds the light emitting element and the light receiving surface, and has transparency and insulating property.

9 Claims, 8 Drawing Sheets

PHOTOCOUPLER AND SEMICONDUCTOR LIGHT EMITTING ELEMENT

CROSS-REFERENCE TO RELATED APPLICATIONS

This application is based upon and claims the benefit of priority from Japanese Patent Application No. 2012-208843, filed on Sep. 21, 2012; the entire contents of which are incorporated herein by reference.

FIELD

Embodiments described herein relate generally to a photocoupler and a semiconductor light emitting element.

BACKGROUND

Photocouplers (including photorelays) can convert an input electrical signal into an optical signal by using a light emitting element, receive light using a light receiving element, and then output an electrical signal. Hence, the photocouplers can transmit electrical signals in a state where the input and output leads are insulated from each other.

In industrial equipment, office equipment, and household appliances, different power supply systems such as a DC voltage system, an AC power supply system, a telephone line system, and a control system are disposed inside one device. However, if different power supply systems and circuit systems are directly coupled, operation errors may occur.

In this case, normal operation can be maintained by using photocouplers because the different power supplies are insulated from each other.

For example, many photocouplers are used in an inverter air conditioners etc. for a load that may include an alternatin current load. In the case where photocouplers are used for signal switching in an integrated circuit tester application, an extremely large number of photocouplers mounted; and it is extremely desirable to reduce the photocoupler size due to the need to reduce the mounting surface area on the substrate.

DETAILED DESCRIPTION

In general, according to one embodiment, a photocoupler includes: a light emitting element; a light receiving element; and a bonding layer. The light emitting element includes a semiconductor stacked body, and a first and a second electrode. The semiconductor stacked body has a first surface and a second surface on an opposite side of the first surface and includes a light emitting layer. The first and second electrodes are provided on the second surface. The light receiving element includes a first and a second electrode on a side of a light receiving surface. The bonding layer bonds the light emitting element and the light receiving surface of the light receiving element, and has transparency and insulating property.

Hereinbelow, embodiments of the invention are described with reference to the drawings.

Figure 1A:
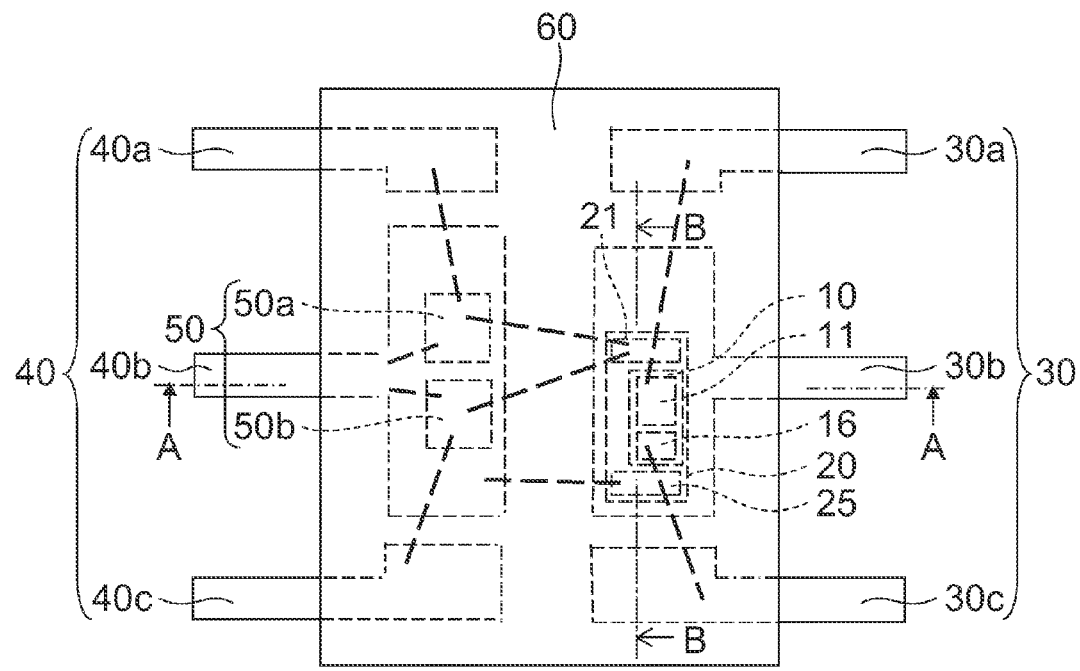
FIG. 1A is a schematic plan view of a photocoupler according to a first embodiment.
Figure 1B:
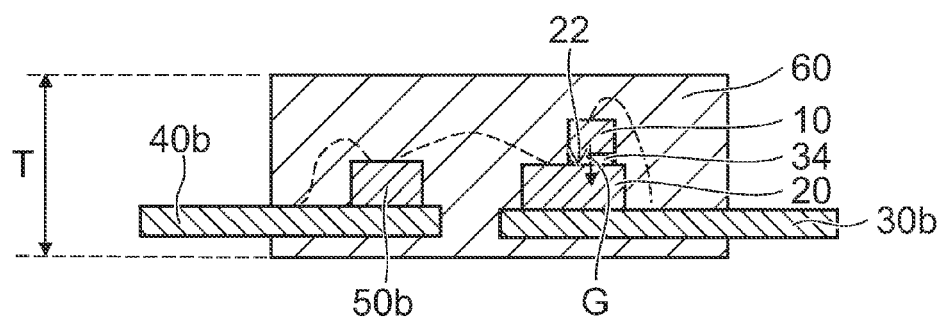
FIG. 1B is a schematic cross-sectional view taken along line A-A.

FIG. 1A is a schematic plan view of a photocoupler according to a first embodiment, and FIG. 1B is a schematic cross-sectional view taken along line A-A.

The photocoupler includes a light emitting element 10, a light receiving element 20, a bonding layer 34, an input lead 30, an output lead 40, and a molded resin body 60.

The light emitting element 10 includes a semiconductor stacked body, and a first electrode 11 and a second electrode 16 provided on the semiconductor stacked body.

The light receiving element 20 includes a first electrode 21 and a second electrode 25 on its light receiving surface 22 side. The light receiving element 20 may be a photodiode, an array in which photodiodes are connected in series, a phototransistor, or a light receiving IC in which a control circuit and an amplifier circuit are further integrated in addition to these. In the specification, it is assumed that the light receiving element 20 further includes a light triggered thyristor or a phototriac.

The bonding layer 34 has transparency and insulating property, and bonds the light emitting element 10 and the light receiving surface 22 side of the light receiving element 20. The bonding layer 34 may be an inorganic material containing glass, $SiO_2$, or the like or a resin material such as an acrylic, a silicone, and a polyimide. The light G emitted downward from a light emitting layer is transmitted through the bonding layer 34 to be incident on the light receiving surface 22.

The input lead 30 includes a second lead 30b to which a stack of the light emitting element 10 and the light receiving element 20 is bonded, a first lead 30a to which the first electrode 11 of the light emitting element 10 is connected, and a third lead 30c to which the second electrode 16 of the light emitting element 10 is connected.

A switching element 50 is mounted on the output lead 40. An FET (field effect transistor) may be used as the switching element 50, for example. Hereinbelow, the case where MOSFETs 50a and 50b are used as the switching element 50 is described as an example.

The output lead 40 includes a first lead 40a connected to the drain of the MOSFET 50a, a second lead 40b to which the MOSFETs 50a and 50b are connected, and a third lead 40c connected to the drain of the MOSFET 50b, and the output electric signal of the light receiving element 20 is outputted from the output lead 40. The output of the light receiving element 20 is inputted to the gates of the two MOSFETs 50a and 50b. The output lead 40 is insulated from the input lead 30.

The sources of the MOSFETs 50a and 50b are connected to the second lead 40b of the output lead 40, and act as a source common. An IGBT (insulated gate bipolar transistor) may be used in place of the MOSFET.

The molded resin body 60 covers the light emitting element 10, the light receiving element 20, and the MOSFETs 50a and 50b with a light-shielding resin. The molded resin body 60 may be a material such as an epoxy.

At least part of the emission light G emitted from the light emitting element 10 to travel downward is transmitted through a support substrate 17 and the bonding layer 34 and is incident on the light receiving surface 22. Thereby, an input electrical signal can be converted into an output electrical signal and can be outputted.

Figure 2:
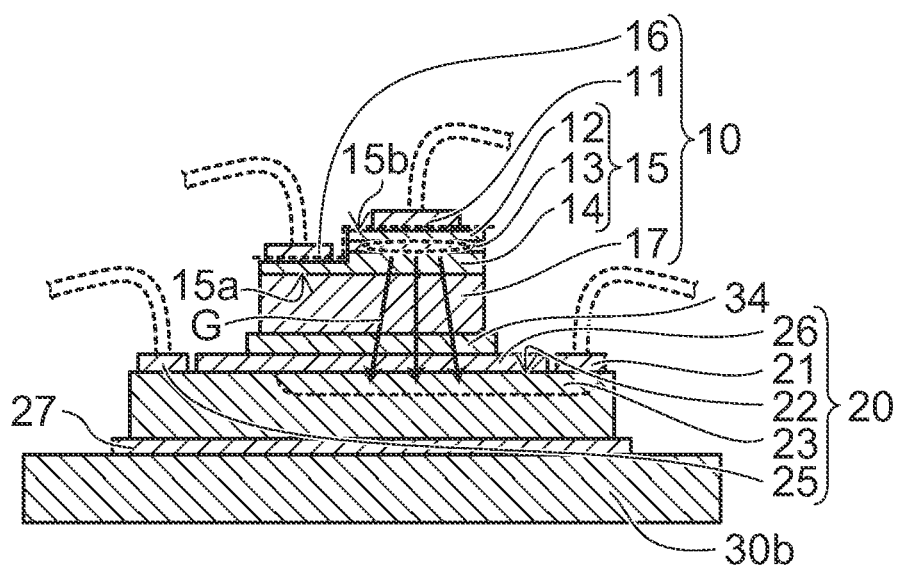
FIG. 2 is a schematic cross-sectional view of the stack of the light receiving element and the light emitting element.

FIG. 2 is a schematic cross-sectional view of the stack of the light receiving element and the light emitting element.

The drawing shows a cross section taken along line B-B of FIG. 1. A semiconductor stacked body 15 includes a first layer 12 having a first conductivity type, a second layer 14 having a second conductivity type layer, and a light emitting layer 13 provided between the first layer 12 and the second layer 14. The first layer 12 includes a contact layer, a current spreading layer, a cladding layer, etc., for example. The second layer 14 includes a cladding layer, for example.

The semiconductor stacked body 15 has a level difference recessed from the upper surface of the first layer 12 and reaching the second layer 14. That is, the semiconductor stacked body 15 has a first surface 15a on the support substrate 17 side and a second surface 15b on the opposite side of the first surface 15a. The second surface 15b includes the upper surface of the first layer 12, the bottom surface of the level difference exposed at the second layer 14, and the side surface of the level difference.

The first electrode 11 of the light emitting element 10 is provided on the upper surface of the first layer 12, and the second electrode 16 is provided on the bottom surface of the level difference. The support substrate 17 may be a semiconductor substrate of GaAs, GaP, Si, or the like. In this case, the wavelength of the emission light G from the light emitting layer 13 is set longer than the band gap wavelength of the support substrate 17 to suppress the absorption of emission light G in the support substrate 17. The support substrate 17 may be also an insulating substrate of quartz, sapphire, or the like.

When the support substrate 17 is made of GaAs, its band gap wavelength is approximately 870 nm. Thus, the wavelength of the emission light G from the light emitting layer 13 formed of an MQW (multi-quantum well) structure or the like is set to 900 to 1100 nm or the like, for example. When the support substrate 17 is made of GaP with a band gap wavelength of approximately 500 nm, the wavelength of emission light G may be set to 700 to 1100 nm or the like.

The light receiving element 20 may be a planar photodiode or the like. In the case where the wavelength of emission light G is in a range of 700 to 1100 nm, the photodiode may be made of Si and thereby high light receiving sensitivity can be obtained. The upper surface of the light receiving region 23 is the light receiving surface 22. The light receiving surface 22 is provided below the light emitting layer 13; therefore, optical coupling efficiency can be enhanced by setting the size of the light receiving surface 22 larger than the size of the light emitting layer 13 in a plan view. The size of the region where the light receiving surface 22 protrudes from the lower surface of the light emitting element 10 may be set smaller than or equal to the size of the lower surface of the light emitting element 10. Thereby, disturbance light being incident on the light receiving surface 22 can be suppressed. Consequently, the operation error of the photocoupler can be reduced.

Figure 3A:
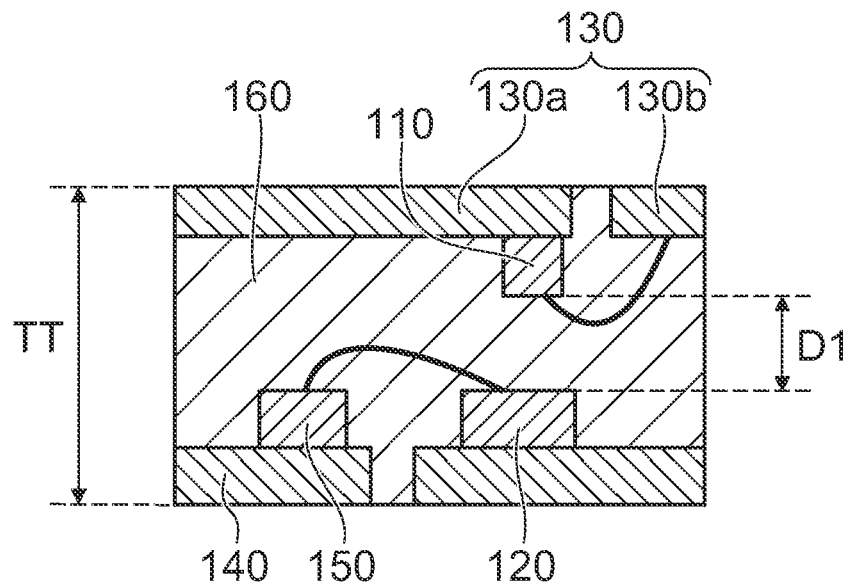
FIG. 3A is a schematic cross-sectional view of a photocoupler according to a comparative example.
Figure 3B:
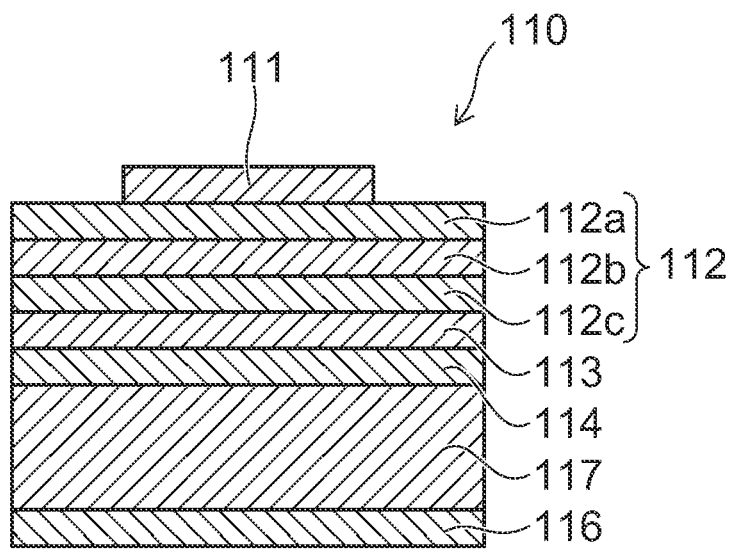
FIG. 3B is a schematic cross-sectional view of a light emitting element thereof.

FIG. 3A is a schematic cross-sectional view of a photocoupler according to a comparative example, and FIG. 3B is a schematic cross-sectional view of a light emitting element thereof.

In a light emitting element 110, a cladding layer 114, a light emitting layer 113, and a first layer 112 are stacked in this order on a substrate 117. The first layer 112 includes a cladding layer 112c, a current spreading layer 112b, and a contact layer 112a, for example. A first electrode 111 is provided on the contact layer 112a, and a second electrode 116 is provided on the lower surface of the substrate 117.

The structure shown in FIG. 3A can be called an opposed type because the light emitting element 110 provided on an input lead 130 and a light receiving element 120 provided on an output lead 140 are opposed to each other. In the opposed structure, the light emitting element 110 and the light receiving element 120 are bonded to different lead frames, and are bonded to the respective lead frames by bonding wires. The input lead frame and the output lead frame are positioned so as to be opposed in a prescribed position, and are fixed by welding or the like, for example. After that, the molding process of a molded resin body 160 is performed.

That is, in the opposed structure, the distance D1 between the surface of the light emitting element 110 and the surface of the light receiving element 120 is large, and it is difficult to reduce the height TT of the photocoupler. In addition, since the distance D1 is large, emission light spreads and optical coupling efficiency is low. In order to correct the low optical coupling efficiency, it is necessary to increase the light output of the light emitting element 110 or increase the light receiving sensitivity of the light receiving element 120. In contrast, in the first embodiment shown in FIG. 1B, it is easy to reduce the height T of the photocoupler, and the device can be thinned and downsized.

Figure 4:
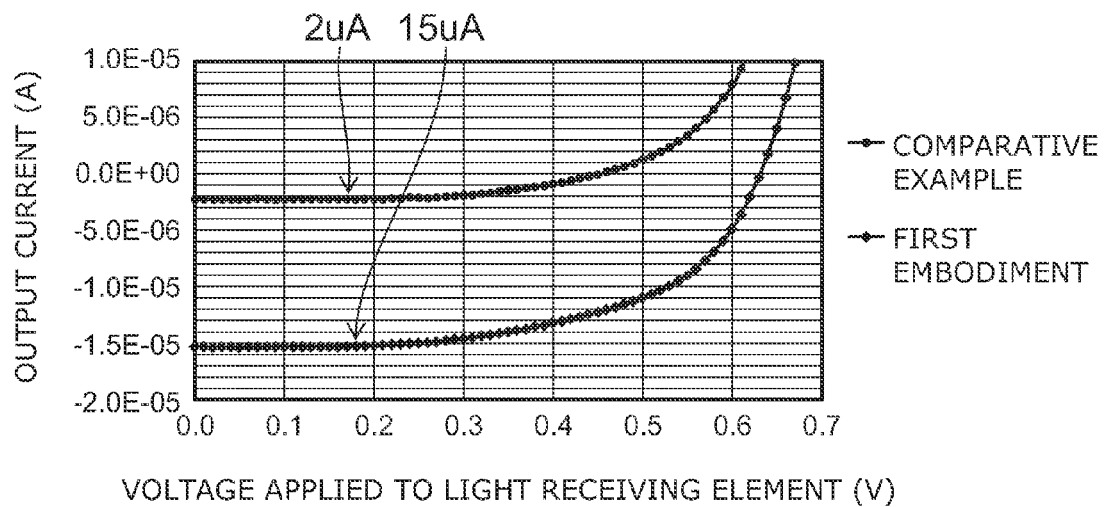
FIG. 4 is a graph showing optical coupling efficiency.

FIG. 4 is a graph showing optical coupling efficiency.

The vertical axis is the output current (A) of the light receiving element 20, and the horizontal axis is the voltage (V) applied to the light receiving element 20. The drive current of the light emitting element 10 is 5 mA in both the first embodiment and the comparative example. When the voltage applied to the light receiving element 20 is 0 V (a short circuit state), an output current of approximately minus 15 µA is obtained in the first embodiment. In contrast, in the comparative example, the output current is approximately minus 2 µA. That is, in the first embodiment, by shortening the distance between the light emitting layer 13 and the light receiving surface 22 and reducing the absorption in the support substrate 17 and the bonding layer 34, a high optical coupling efficiency of approximately seven times the optical coupling efficiency of the comparative example can be obtained. Furthermore, by stacking the light emitting element 10 and the light receiving element 20, the photocoupler can be thinned.

Figure 5:
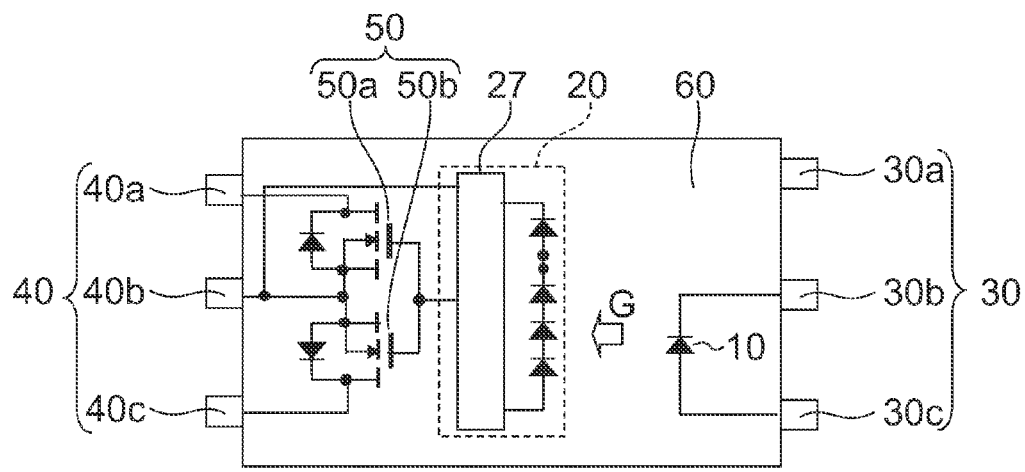
FIG. 5 is a configuration diagram of the photocoupler of the first embodiment.

FIG. 5 is a configuration diagram of the photocoupler of the first embodiment.

The light receiving element 20 may be a light receiving IC including a control circuit 27, for example. The control circuit 27 drives the MOSFETs 50a and 50b having a common-source connection by suppling the gates with the photoelectromotive force of the photodiode array or the like. When an AC load is connected between the first lead 40a and the third lead 40c of the output lead 40 connected to the drains, a continuous sine wave can be outputted while low loss is kept, like a mechanical relay. Thus, the photocoupler can be used for an NCU (network control unit) circuit of a FAX modem and the like, for example. In the case of DC load control, the number of MOSFETs may be one.

Figure 6A:
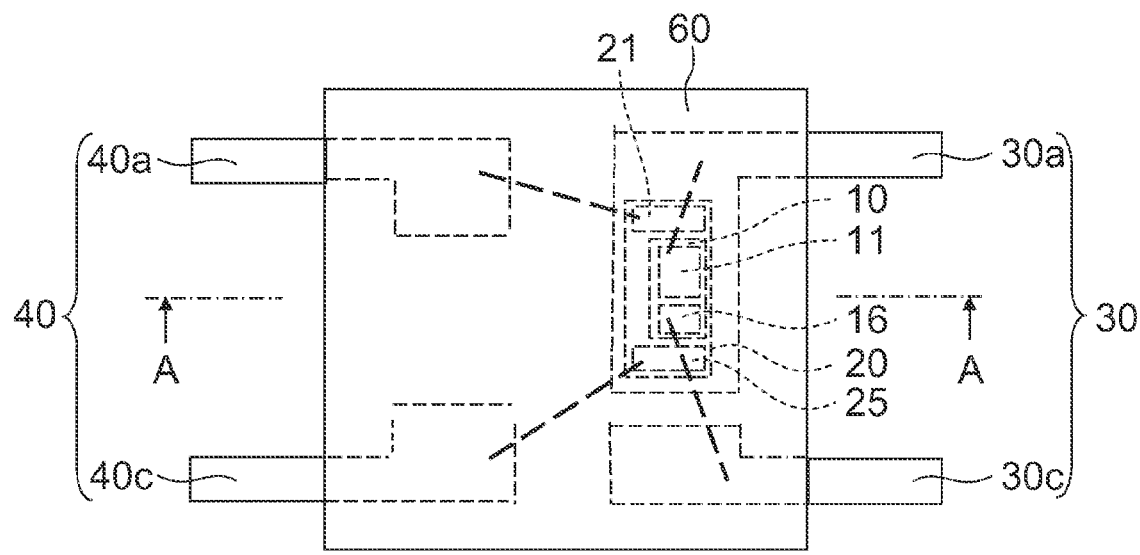
FIG. 6A is a schematic plan view of a photocoupler according to a second embodiment.
Figure 6B:
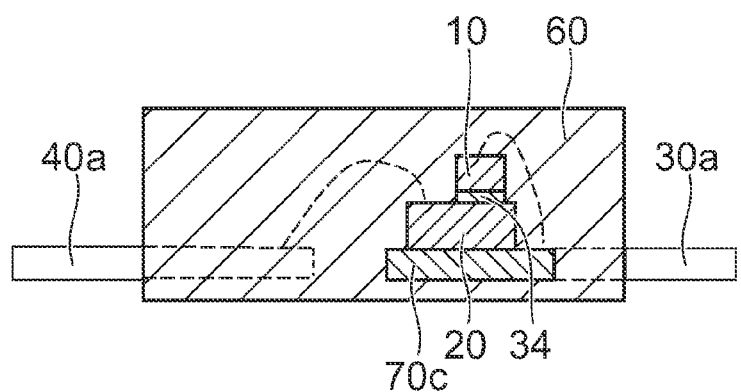
FIG. 6B is a schematic cross-sectional view taken along line A-A.

FIG. 6A is a schematic plan view of a photocoupler according to a second embodiment, and FIG. 6B is a schematic cross-sectional view taken along line A-A.

The first electrode 21 of the light receiving element 20 may be connected to the first lead 40a of the output lead. The second electrode 25 of the light receiving element 20 may be connected to the third lead 40c of the output lead 40. When the light receiving element 20 is formed of a phototransistor, transistor output can be obtained. When the light receiving element 20 is formed of a photodiode array, photoelectromotive force (photovoltaic) output can be obtained. When the light receiving element 20 is formed of a light receiving IC, logic output can be obtained.

A thyristor or a triac may be provided on the output lead 40 and may be connected to the light receiving element 20 such as a photodiode, a phototransistor, and a light receiving IC. Thereby, an external load such as a motor can be driven by an AC signal.

Figure 7A:
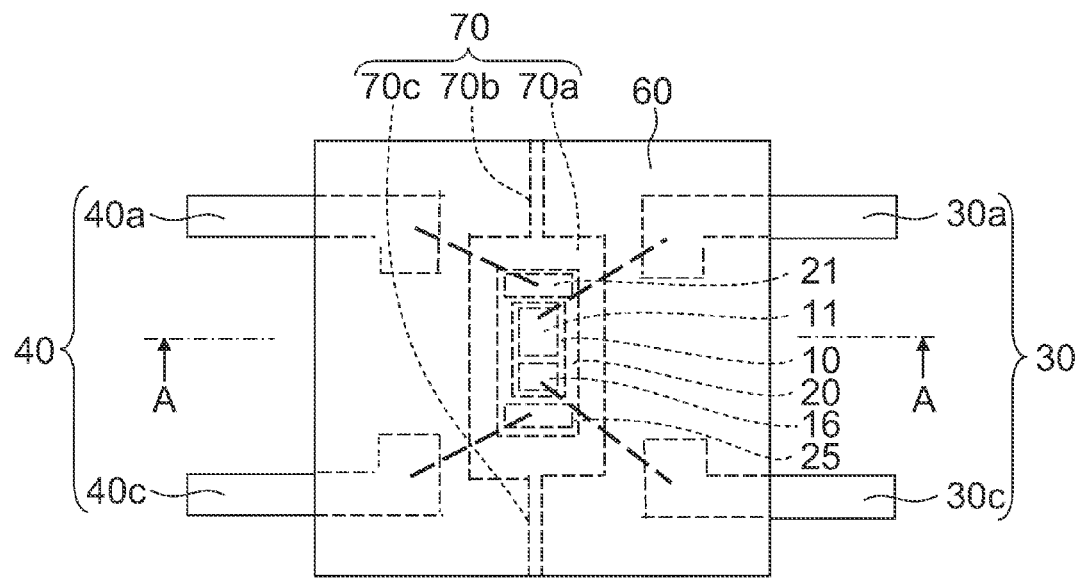
FIG. 7A is a schematic plan view of a photocoupler according to a third embodiment.
Figure 7B:
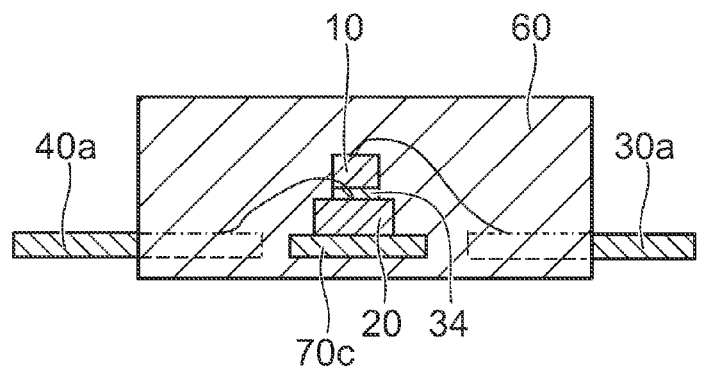
FIG. 7B is a schematic cross-sectional view taken along line A-A.

FIG. 7A is a schematic plan view of a photocoupler according to a third embodiment, and FIG. 7B is a schematic cross-sectional view taken along line A-A.

The lead frame may include a die pad unit 70 between the input lead 30 and the output lead 40. The die pad unit 70 may include a mount portion 70a and hanging pins 70b and 70c.

The light emitting element 10 and the light receiving element 20 are stacked via the bonding layer 34. The stack of the light emitting element 10 and the light receiving element 20 is bonded to the mount portion 70a by a solder material, an adhesive, or the like. The first electrode 11 of the light emitting element 10 is connected to the first lead 30a of the input lead 30, and the second electrode 16 is connected to the third lead 30c. The first electrode 21 of the light receiving element 20 is connected to the first lead 40a of the output lead, and the second electrode 25 is connected to the third lead 40c.

After the molded resin body 60 having light-shielding properties is formed, the hanging pins 70b and 70c are cut near the outer edge of the molded resin body 60. In the third embodiment, the input lead 30, the die pad unit 70, and the output lead 40 are formed of one lead frame; therefore, the thickness can be made thin. Also the manufacturing process is simpler than in the comparative example.

By the first to third embodiments, an electrical signal can be outputted in a state where the input and the output are insulated from each other, and a photocoupler can be provided in which optical coupling efficiency is enhanced and the thinning of the device and the reduction of the mounting area are easy. Such a photocoupler can be widely used for industrial equipment, office equipment, household appliances, etc.

Figure 8:
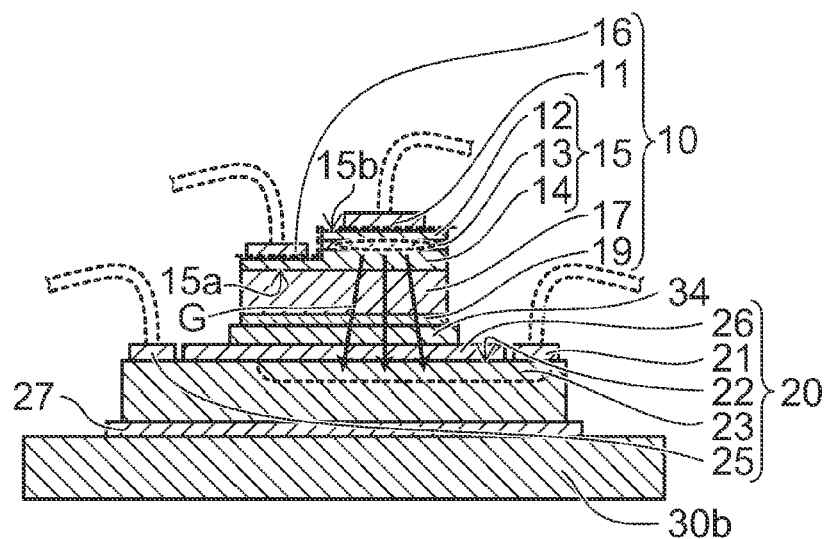
FIG. 8 is a schematic cross-sectional view of a first modification example of the stack of the light receiving element and the light emitting element.

FIG. 8 is a schematic cross-sectional view of a first modification example of the stack of the light receiving element and the light emitting element.

The light emitting element 10 includes a transparent layer 19 on the lower surface of the support substrate 17. The light emitting element wafer is attached to a tape or the like, and is diced. After that, when individual chips are picked up, breaking damage due to the shock of pushing up by pins may occur on the lower surface side of the chip. In a common light emitting element 10, since an electrode with a thickness of 0.3 µm or more, for example, is provided on the lower surface side, the shock at the time of picking up is eased.

In the embodiment, it is difficult to provide an electrode on the entire surface of the light emitting element 10 because the light emitting element 10 emits light from its lower surface side. Thus, a transparent conductive film (ITO; indium in oxide) or a layer transmissive to emission light G made of a transparent insulator such as $SiO_2$, SiN, and SiON may be provided on at least part of the lower surface side of the support substrate 17. Thereby, the shock generated at the time of picking up can be eased. Furthermore, the dielectric breakdown voltage is increased by providing a transparent insulator, and the dielectric breakdown voltage is further increased by using an insulating substrate of quartz, sapphire, or the like as the support substrate.

Figure 9A:
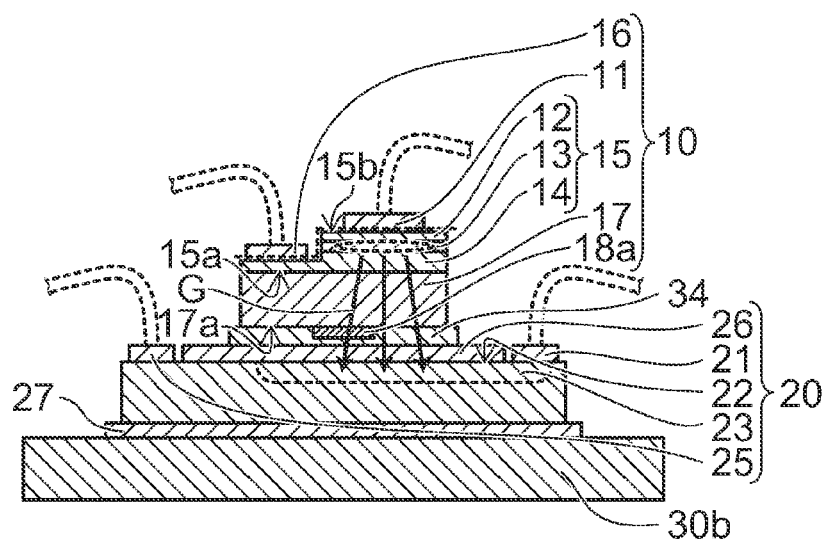
FIG. 9A is a schematic cross-sectional view of a second modification example of the stack of the light receiving element and the light emitting element.
Figure 9B:
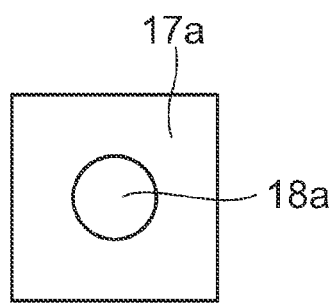
FIG. 9B is a schematic bottom view of the light emitting element.

FIG. 9A is a schematic cross-sectional view of a second modification example of the stack of the light receiving element and the light emitting element, and FIG. 9B is a schematic bottom view of the light emitting element.

A metal layer 18a containing Au, Ag, or the like may be provided in a region where a push-up pin comes into contact. Thereby, the mechanical shock at the time of picking up can be eased. The thickness of the metal layer 18a may be 0.3 µm or more, for example. The diameter thereof may be 100 µm or the like, for example. By such a configuration, emission light G can be incident on the light receiving surface 22 of the light receiving element 20 from a region 17a of the support substrate 17 where the metal layer 18 is not provided (the outside of the metal layer 18a). The configuration of 17a and 18a may be reversed when the region where the push-up pin comes into contact is changed.

Figure 10A:
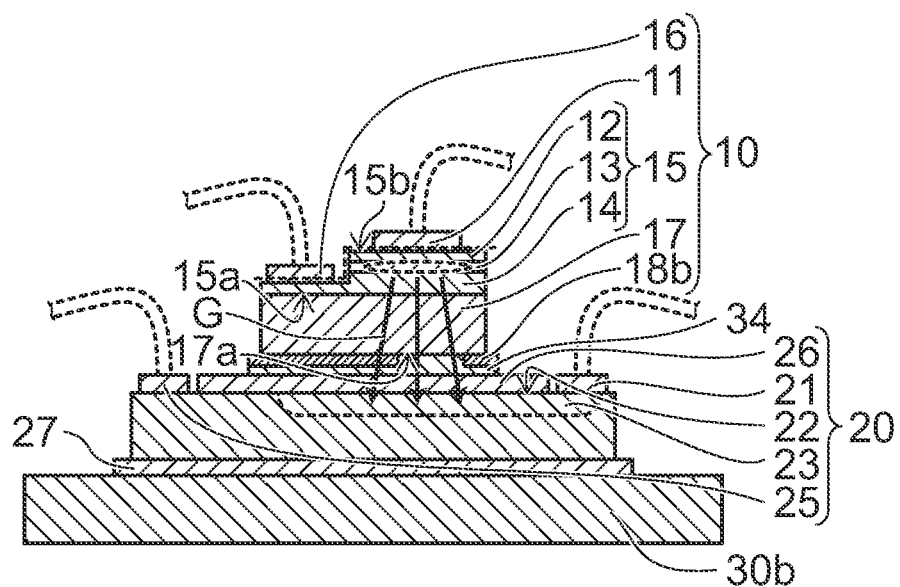
FIG. 10A is a schematic cross-sectional view of a third modification example of the stack of the light receiving element and the light emitting element.
Figure 10B:
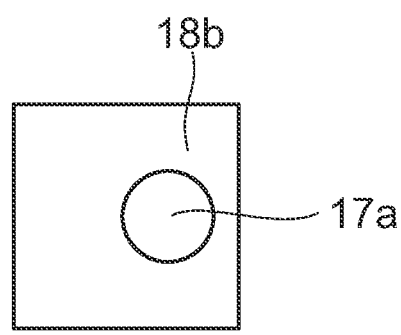
FIG. 10B is a schematic bottom view of the light emitting element.

FIG. 10A is a schematic cross-sectional view of a third modification example of the stack of the light receiving element and the light emitting element, and FIG. 10B is a schematic bottom view of the light emitting element.

A metal layer 18b containing Au, Ag, or the like may be provided in a region where a push-up pin comes into contact. Thereby, the shock at the time of picking up can be eased. The thickness of the metal layer 18b may be 0.3 µm or more, for example. An opening with an inner diameter of 100 µm is provided in the metal layer 18b, for example. By such a configuration, emission light G can be incident on the light receiving surface 22 of the light receiving element 20 from a region 17a of the support substrate 17 where the metal layer 18b is not provided.

By the first to third modification examples of the stack of the light emitting element and the light receiving element, the shock damage in the process of picking up chips can be suppressed, and the reliability of the photocoupler can be enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A photocoupler comprising:
   a light receiving element including a first and a second electrode and a light receiving region;
   a light emitting element provided on the light receiving element, the light emitting element including a semiconductor stacked body, and a first and second electrode; and
   a bonding layer provided between the light receiving element and the light emitting element, the bonding layer bonding the light emitting element and the light receiving region of the light receiving element and having transparency and insulating property, a size of the light receiving region being smaller than or equal to a size of the light emitting layer in a plan view.

2. The photocoupler according to claim 1, wherein the light emitting element further includes a substrate having transparency, and the bonding layer bonds the substrate.

3. The photocoupler according to claim 1, further comprising:
an input lead connected to the first and second electrodes of the light emitting element;
an output lead connected to the first and second electrodes of the light receiving element; and
a switching element provided between the light receiving element and the output lead.

4. The photocoupler according to claim 3, wherein the switching element includes two MOSFETs having a common-source connection.

5. The photocopier according to claim 1, wherein the light receiving element includes a photodiode array connected in series or a light receiving IC.

6. The photocoupler according to claim 2, wherein the substrate has a band gap wavelength shorter than a wavelength of emission light from a light emitting layer.

7. The photocoupler according to claim 2, wherein the substrate contains one of GaAs, GaP, and sapphire.

8. The photocoupler according to claim 1, wherein the bonding layer contains one of an epoxy resin, a silicone resin, and a polyimide resin.

9. The photocoupler according to claim 2, wherein the light emitting element further includes a metal layer selectively provided on a surface of the substrate and bonded to the bonding layer.

* * * * *